US008004343B2

(12) United States Patent
Kobayashi

(10) Patent No.: US 8,004,343 B2
(45) Date of Patent: Aug. 23, 2011

(54) DRIVER CIRCUIT AND INK JET PRINTER HEAD DRIVER CIRCUIT

(75) Inventor: Isao Kobayashi, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 1306 days.

(21) Appl. No.: 10/983,057

(22) Filed: Nov. 8, 2004

(65) Prior Publication Data

US 2005/0099749 A1 May 12, 2005

(30) Foreign Application Priority Data

Nov. 11, 2003 (JP) ................................ 2003-381569

(51) Int. Cl.
*H03K 17/56* (2006.01)
*H03K 19/018* (2006.01)
*B41J 2/045* (2006.01)

(52) U.S. Cl. .......... 327/412; 327/409; 327/112; 326/31; 347/6; 347/211

(58) Field of Classification Search ........................ None
See application file for complete search history.

(56) References Cited

U.S. PATENT DOCUMENTS 5,402,081 A * 3/1995 Wong et al. .................... 327/256
5,426,383 A * 6/1995 Kumar .......................... 326/119
5,594,369 A * 1/1997 Kondoh et al. ................. 326/83
5,656,970 A * 8/1997 Campbell et al. ............. 327/565
6,100,646 A 8/2000 Janczak et al.
6,334,668 B1 * 1/2002 Isamoto .......................... 347/57
6,426,658 B1 * 7/2002 Mueller et al. ................ 327/112
6,604,817 B2 8/2003 Isono et al. ...................... 347/71
6,661,208 B2 * 12/2003 Rutter et al. .................. 323/224
6,759,880 B2 * 7/2004 Koch et al. .................... 327/112
2006/0170477 A1 * 8/2006 Ariyoshi ....................... 327/272

FOREIGN PATENT DOCUMENTS

JP 4-162824 * 8/1992

(Continued)

OTHER PUBLICATIONS

Kumar, Vikas. "Ground Bounce Primer." *Planet Analog*. May 2005. http://www.planetanalog.com/showArticle?articleID=192200276.

(Continued)

*Primary Examiner* — Lincoln Donovan
*Assistant Examiner* — Terry L Englund
(74) *Attorney, Agent, or Firm* — Oliff & Berridge, PLC

(57) ABSTRACT

A driver circuit includes first and second switching elements connected in series to two ends of an electric voltage source. A driven load having a capacity is connected to a connection line connecting the first and second switching elements to each other. An inverter inverts a control signal into an inverted control signal applied to the second switching element. When the first switching element is turned on by the control signal and the second switching element is turned off by the inverted control signal, a drive voltage is applied from one of the two ends of the electric voltage source to the driven load. When the first switching element is turned off by the control signal and the second switching element is turned on by the inverted control signal, an electric charge of the driven load is discharged to another of the two ends of the electric voltage source.

9 Claims, 7 Drawing Sheets

FOREIGN PATENT DOCUMENTS

| | | |
|---|---|---|
| JP | A-8-171268 | 7/1996 |
| JP | B2-2689415 | 8/1997 |
| JP | A-2000-211126 | 8/2000 |
| JP | A-2000-280463 | 10/2000 |
| JP | A-2001-246744 | 9/2001 |
| JP | A-2002-533882 | 10/2002 |

OTHER PUBLICATIONS

Fairchild Semiconductor. "Understanding and Minimizing Ground Bounce." Jun. 1989 Revised Feb. 2003. pp. 1-16.

Partial English-language translation of Japanese Office Action mailed on Sep. 15, 2009.

* cited by examiner

PRIOR ART

PRIOR ART

DRIVER CIRCUIT AND INK JET PRINTER HEAD DRIVER CIRCUIT

The present application is based on Japanese Patent Application No. 2003-381569 filed on Nov. 11, 2003, the contents of which are incorporated herein by reference.

BACKGROUND OF THE INVENTION

1. Field of the Invention

The present invention relates to a driver circuit that applies a drive voltage to a driven load, and in particular to an ink jet recording head driver circuit that applies a drive voltage to an ink jet recording head including, e.g., one or more piezoelectric elements.

2. Discussion of Related Art

In recent years, impact printers have been replaced with non-impact printers and the non-impact printers have expanded their market. Out of various sorts of non-impact printers, an ink jet printer can operate on the basis of one of the simplest principles and can easily print a multi-gray-scale-step image and/or a full-color image. Out of various types of ink jet printers, a drop-on-demand ink jet printer that ejects only droplets of ink to be used to print images has been quickly popularized because of its high ejection efficiency and/or its low running cost.

Japanese Patent Application Publication P2000-280463A, Japanese Patent Application Publication P2000-211126A, or Japanese Patent No. 2689415 discloses an ink jet printer including an ink jet recording head having a piezoelectric element and an ink ejection nozzle, and additionally including a driver circuit that applies a pulse-like electric potential to the recording head so as to deform the piezoelectric element and thereby eject a droplet of ink from the nozzle. In the conventional ink jet recording head driver circuit, a so-called totem pole circuit, as shown in FIG. 6, is employed to apply the electric potential to the piezoelectric element. In the totem pole circuit of FIG. 6, a first bipolar transistor Tra and a second bipolar transistor Trb are connected in series to a positive-potential electric voltage source Vcc and a ground GND, and a piezoelectric element is connected via a resistor R to a connection point where the two transistors Tra, Trb are connected to each other. A control signal Ina is applied to a base of the first transistor Tra, and an inverted control signal Inb, produced by inverting the control signal Ina using an inverter INV, is applied to a base of the second transistor Trb. Since the second transistor Trb is turned on when the first transistor Tra is turned off, an electric charge of the piezoelectric element as a sort of capacitative load is discharged via the second transistor Trb to the ground GND. Thus, the pulse-like electric potential applied to the piezoelectric element can fall steeply. To control accurately the time when the pulse-like electric potential falls is essentially needed to operate the piezoelectric element to eject efficiently the droplets of ink. To this end, the ink jet recording head driver circuit employs the totem pole circuit.

However, it has been found that in the above indicated totem pole circuit, when the first transistor Tra is changed from its OFF (turned-off) state to its ON (turned-on) state, the changing of the second transistor Trb from its ON state to its OFF state may be delayed. In this event, the first and second transistors Tra, Trb are simultaneously placed in their ON states for a moment. The reason why the two transistors Tra, Trb are simultaneously placed in their ON states will be explained below by reference to a time chart shown in, FIG. 7. FIG. 7 shows a waveform of the control signal Ina, a waveform of the inverted control signal Inb, an operation state of the first transistor Tra, and an operation state of the second transistor Trb.

When the control signal Ina is changed from its low level to its high level, an electric voltage of the control signal Ina gradually increases between a time t11 and a time t13. Here it is noted that this transitional change of the signal voltage is, in fact, represented by a complex quadratic curve but, in FIG. 7, it is represented by a simple straight line. In the conventional driver circuit, a threshold voltage value of the inverter INV is pre-set at 50% of the highest electric potential of the control signal Ina, i.e., an average of the low level and the high level of the signal Ina. Therefore, when the control signal Ina is changed from its low level to its high level, an output of the inverter INV, i.e., the inverted control signal Ina starts changing from its high level to its low level, at a time t12 when the electric potential of the control signal Ina becomes equal to the above-indicated threshold voltage, 50%, of the inverter INV. In addition, a threshold voltage value of the first transistor Tra is pre-set at 50% of the highest electric potential of the control signal Ina. Therefore, at time t12 when the electric potential of the control signal Ina becomes equal to the threshold value, 50%, of the first transistor Tra, the first transistor Tra is turned on. On the other hand, a threshold voltage value of the second transistor Trb is pre-set at 50% of the highest electric potential of the inverted control signal Inb. Therefore, at a time t13 when the electric potential of the inverted control signal Inb becomes equal to the threshold value, 50%, of the second transistor Trb, the second transistor Trb is turned off. Thus, the first and second transistors Tra, Trb are simultaneously placed in their ON states for a time duration between time t12 and time t13.

If the first and second transistors Tra, Trb are simultaneously placed in their ON states, then a high electric potential (e.g., 20 V) of the electric voltage source Vcc that drives the piezoelectric element is applied to the ground GND, so that an electric potential of the ground GND is instantaneously increased, which may lead to causing a malfunction of a driver IC (integrated circuit) as part of the driver circuit. In addition, the electric potential of the ground GND may exceed a drive voltage (e.g., 3.3 V) of other transistors of the driver IC, so that a back bias may be applied to the other transistors and thereby cause disorders of the same.

SUMMARY OF THE INVENTION

It is therefore an object of the present invention to provide a driver circuit, in particular, an ink jet recording head driver circuit, which is free of at least one of the above-identified problems. It is another object of the present invention to provide a driver circuit in the form of a totem pole circuit that can prevent two switching elements thereof from being simultaneously turned on.

The above objects may be achieved by the present invention. According to a first aspect of the present invention, there is provided a driver circuit, comprising a first switching element and a second switching element which are connected in series to two ends of an electric voltage source, such that a driven load having a capacity is connected to a connection line connecting the first and second switching elements to each other; and an inverter which inverts, when a control signal having a variable voltage is applied to the first switching element, the control signal into an inverted control signal, so that the inverted control signal is applied to the second switching element. In a state in which the first switching element is turned on by the control signal and the second switching element is turned off by the inverted control signal, a drive voltage is applied from one of the two ends of the electric voltage source to the driven load and, in a state in which the first switching element is turned off by the control signal and the second switching element is turned on by the inverted control signal, an electric charge of the driven load is discharged to an other of the two ends of the electric voltage source. A first threshold voltage to turn on the first switching element and a second threshold voltage to turn off the second switching element are pre-set such that a first time duration in which the first switching element is turned on and a second time duration in which the second switching element is turned on do not overlap each other.

In the driver circuit in accordance with the first aspect of the present invention, the threshold voltage to turn on the first switching element and the threshold voltage to turn off the second switching element are pre-set such that the time duration in which the first switching element is turned on, and the time duration in which the second switching element is turned on do not overlap each other. For example, if a threshold voltage of a base (a gate) of a first transistor as the first switching element that turns on and off the first transistor is increased, an increased time is needed before the first transistor is turned on in response to the variation of voltage of the control signal, and a decreased time is taken before the first transistor is turned off in response to the variation of voltage of the control signal. Preferably, the threshold voltage of the base of the first transistor is not lower than 60% of the highest voltage of the control signal, more preferably, not lower than 75% of the highest voltage. In addition, if a threshold voltage of a base (a gate) of a second transistor as the second switching element that turns on and off the second transistor is increased, a decreased time is taken before the second transistor is turned off in response to the variation of voltage of the control signal inverted by the inverter, and an increased time is needed before the second transistor is turned on in response to the variation of voltage of the inverted control signal. Preferably, the threshold voltage of the base of the second transistor is not lower than 60% of the highest voltage of the inverted control signal, more preferably, not lower than 75% of the highest voltage. Therefore, when the voltage of the control signal varies, the first switching element is turned on by the control signal after the second switching element is turned off by the control signal inverted by the inverter. Similarly, the first switching element is turned off before the second switching element is turned on. Thus, the fist and second switching elements can be prevented from being simultaneously turned on.

According to a second aspect of the present invention, there is provided an ink jet recording head driver circuit for applying, to an ink jet recording head, a drive voltage to drive the ink jet recording head so as to eject a droplet of ink, the ink jet recording head driver circuit comprising a first switching element and a second switching element which are connected in series to two ends of an electric voltage source, such that the ink jet recording head is connected to a connection line connecting the first and second switching elements to each other; and an inverter which inverts, when a control signal having a variable voltage is applied to the first switching element, the control signal into an inverted control signal, so that the inverted control signal is applied to the second switching element. In a state in which the first switching element is turned on by the control signal and the second switching element is turned off by the inverted control signal, the drive voltage is applied from one of the two ends of the electric voltage source to the ink jet recording head and, in a state in which the first switching element is turned off by the control signal and the second switching element is turned on by the inverted control signal, an electric charge of the ink jet recording head is discharged to an other of the two ends of the electric voltage source. A first threshold voltage to turn on the first switching element and a second threshold voltage to turn off the second switching element are pre-set such that a first time duration in which the first switching element is turned on and a second time duration in which the second switching element is turned on do not overlap each other.

In the ink jet recording head driver circuit in accordance with the second aspect of the present invention, the threshold voltage to turn on the first switching element and the threshold voltage to turn off the second switching element are pre-set such that the time duration in which the first switching element is turned on, and the time duration in which the second switching element is turned on do not overlap each other, For example, if a threshold voltage of a base (a gate) of a first transistor as the first switching element that turns on and off the first transistor is increased, an increased time is needed before the first transistor is turned on in response to the variation of voltage of the control signal, and a decreased time is taken before the first transistor is turned off in response to the variation of voltage of the control signal. Preferably, the threshold voltage of the base of the first transistor is not lower than 60% of the highest voltage of the control signal more preferably, not lower than 75% of the highest voltage. In addition, if a threshold voltage of a base (a gate) of a second transistor as the second switching element that turns on and off the second transistor is increased a decreased time is taken before the second transistor is turned off in response to the variation of voltage of the control signal inverted by the inverter, and an increased time is needed before the second switching element is turned on in response to the variation of voltage of the inverted control signal. Preferably, the threshold voltage of the base of the second transistor is not lower than 60% of the highest voltage of the inverted control signal more preferably, not lower than 75% of the highest voltage. Therefore, when the voltage of the control signal varies, the first switching element is turned on by the control signal after the second switching element is turned off by the control signal inverted by the inverter. Similarly, the first switching element is turned off before the second switching element is turned on. Thus, the first and second switching element can be prevented from being simultaneously turned on. Therefore, an electric potential of a ground as an example of the other of the two ends of the electric voltage source of the driver circuit can be prevented from being excessively largely changed, and accordingly a malfunction or a disorder of a driver IC that drives the ink jet recording head can be prevented from being caused by the excessively large change of the electric potential of the ground. For example, in the case where the ink jet recording head includes a piezoelectric element as a driven load, the piezoelectric element can be controlled in an appropriate manner.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described a preferred embodiment of the present invention by reference to the drawings.

First, a construction of an ink jet recording apparatus to which the present invention is applied will be described by reference to FIGS. 1 and 2.

Figure 1:
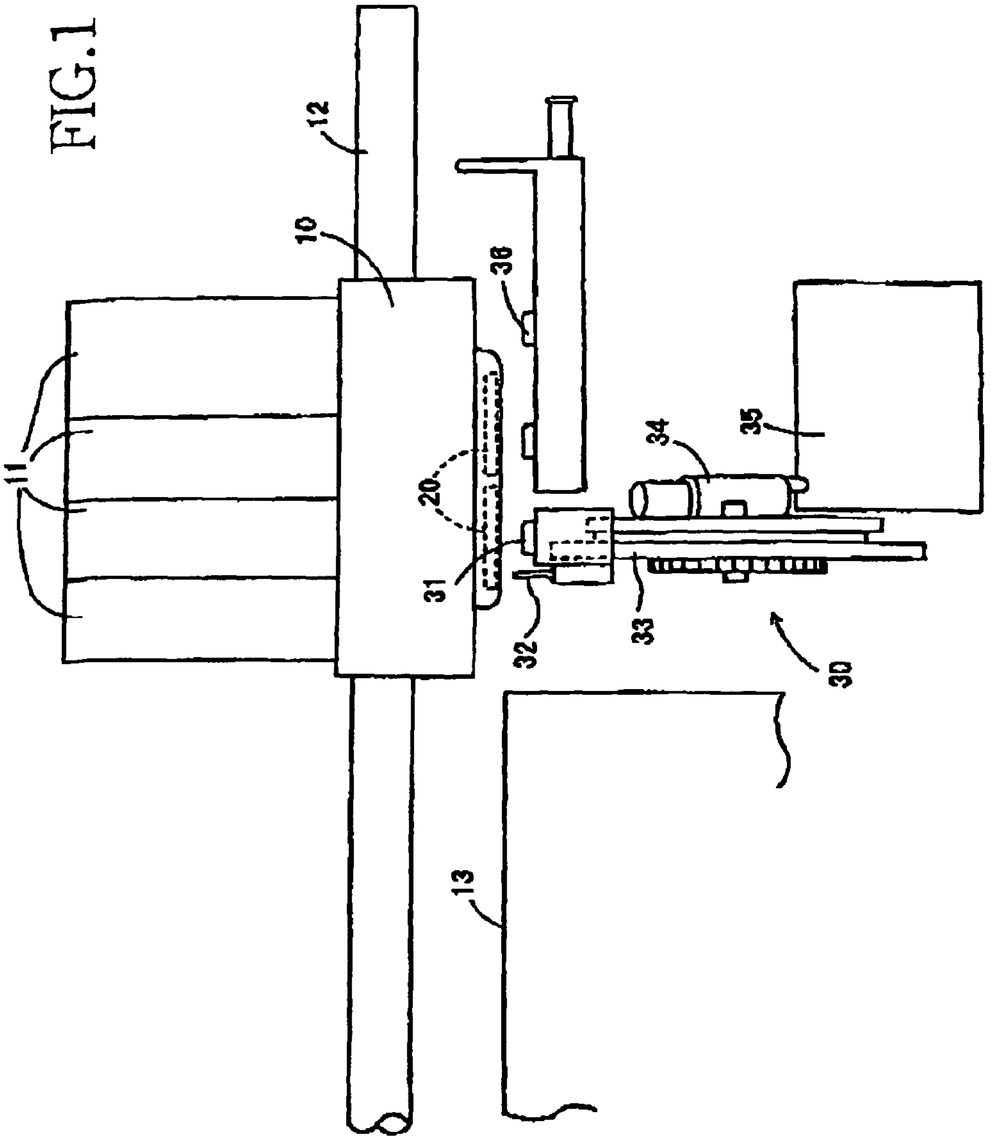
FIG. 1 is an illustrative view for explaining a construction of an ink jet recording apparatus to which the present invention is applied.
Figure 2:
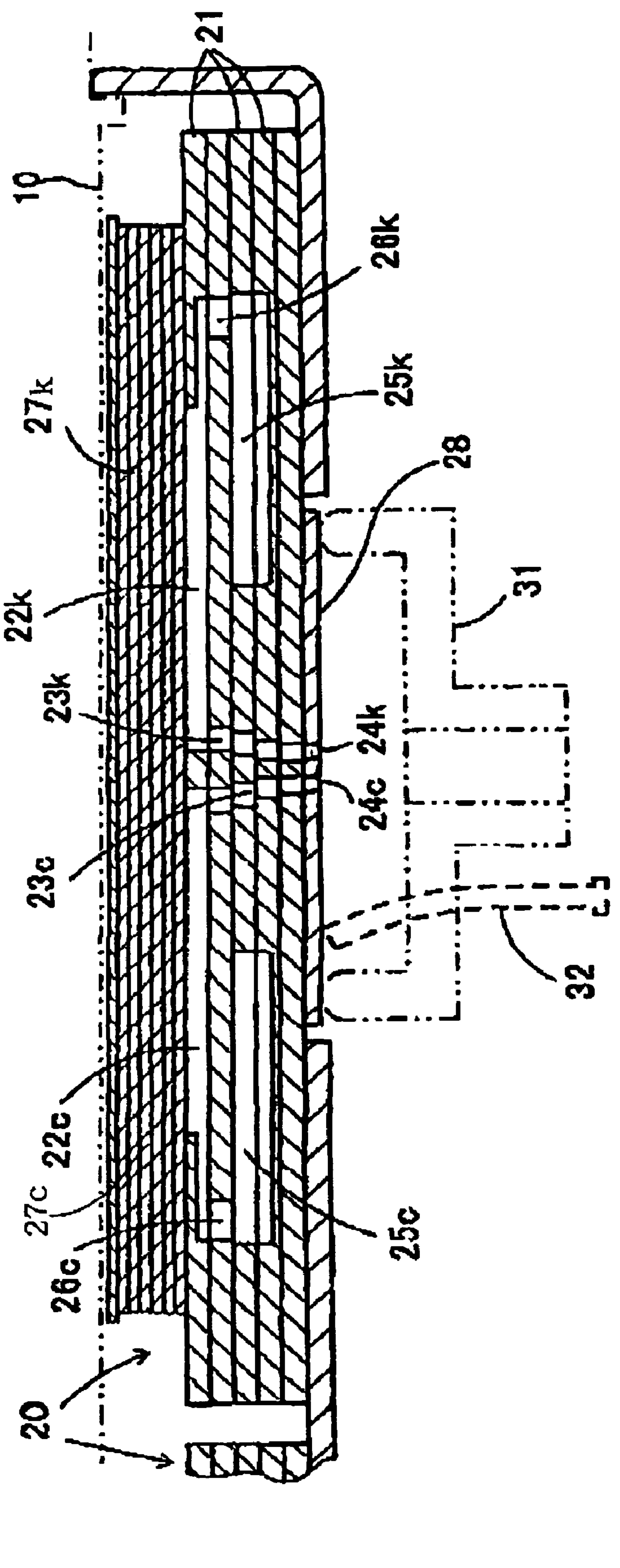
FIG. 2 is an illustrative view of an ink jet recording head of the apparatus of FIG. 1.

As shown in FIG. 1, the ink jet recording apparatus includes two ink jet recording heads 20 that are mounted on a movable carriage 10 and are moved by the carriage 10 along an axis member 12 extending parallel to a recording medium (e.g., a recording sheet) that is fed by a feeding portion 13. Each of the recording heads 20 ejects droplets of ink onto the recording sheet. The carriage 10 carries four ink cartridges 11 that store a black ink, a cyan ink, a yellow ink, and a magenta ink, respectively. The black and cyan inks are supplied to a first one of the two recording heads 20, and the yellow and magenta inks are supplied to the other, second recording head 20. As shown in FIG. 2, the first recording head 20 has, in a lower surface (i.e., a nozzle supporting surface) 28 thereof a plurality of nozzles 24*k* (only one nozzle 24*k* is shown in the figure) that eject respective droplets of black inks and are arranged in an array extending in a direction perpendicular to the drawing sheet of FIG. 2, and a plurality of nozzles 24*c* (only one nozzle 24C is shown in the figure) that eject respective droplets of cyan inks and are arranged in an array extending in the same direction. Likewise, the second recording head 20 has a plurality of nozzles, not shown, that eject respective droplets of yellow in, ad a plurality of nozzles, not shown, that eject respective droplets of magenta inks.

Each of the ink jet recording heads 20 has a construction similar to that of an ink jet recording head disclosed by Japanese Patent Application Publication P2001-246744A or its corresponding U.S. Pat. No. 6,604,817. In short, as shown in FIG. 2, the first recording head 20 has two common ink chambers (i.e., two ink manifolds) 25*k*, 25*c* that are independent of each other, are supplied with the black and cyan inks from the black ink and cyan ink cartridges 11, respectively, and supply the black and cyan inks to an array of black ink pressure chambers 22*k* and an array of cyan ink pressure chambers 22*c*, respectively, via an array of black ink communication holes 26*k*, and an array of cyan ink communication holes 26*c*, respectively. The black ink pressure chambers 22*k* are independent of each other, and the cyan ink pressure chambers 22*c* are independent of each other. In addition, the first recording head 20 has an array of black ink piezoelectric actuators 27*k* and an array of cyan ink piezoelectric actuators 27*c* each of which is formed of a piezoelectric ceramics. The black ink piezoelectric actuators 27*k* apply respective pressures to the black inks accommodated in the corresponding black ink pressure chambers 22*k*, so that respective droplets of the black inks are ejected from the corresponding black ink ejection nozzles 24*k* via corresponding black ink communication holes 23*k*; and the cyan ink piezoelectric actuators 27*c* apply respective pressures to the cyan inks accommodated in the corresponding cyan ink pressure chambers 22*c*, so that respective droplets of the cyan inks are ejected from the corresponding cyan ink ejection nozzles 24*c* via corresponding cyan ink communication holes 23*c*. The chambers 22*k*, 22*c*, 25*k*, 25*c* and the holes 23*k*, 23*c*, 26*k*, 26*c* are formed through respective thickness of a plurality of metallic sheets 21, and are communicated with each other in a state in which those metallic plates 21 are stacked on each other. Only a sheet defining the nozzle supporting surface 28 is formed of a synthetic resin (e.g., polyimide), and the outer surfaces of the sheet are coated with a water-repellent film. The second recording head 20 has a construction similar to that described above with respect to the first recording head 20.

In FIG. 1, reference numeral 30 designates a maintenance device that performs a recovering operation on each of the ink jet recording heads 20, not only regularly but also irregularly, e.g., when the each recording head 20 has failed to eject droplets of inks in a normal manner. More specifically described, when the carriage 10 is moved to a position offset from the recording-sheet feeding portion 13, a suction cap 31 is moved, by a cam 33, toward, e.g., the first recording head 20 so as to closely contact the nozzle supporting surface 28 thereof and thereby cover the arrays of ink ejection nozzles 24*k*, 24*c* thereof. Then, a suction pump 34 is driven or operated so that the suction cap 31 simultaneously applies suction to the inks remaining in the nozzles 24*k*, 24*c* and the thus sucked inks are discharged into a waste-ink tank 35. Subsequently, the suction cap 31 is moved away from the nozzle supporting surface 28. When there is a need to perform a recovering operation on the second recording head 20 having the yellow ink and magenta ink ejection nozzles, the carriage 10 is moved to a position where those nozzles are opposed to the suction cap 31, and the above-described steps are repeated. Then, a wiper 32 is moved, by the cam 33, toward the recording heads 20, and the carriage 10 is moved along the member 12 in a leftward direction in FIG. 1. Thus, the wiper 32 wipes or cleans the nozzle supporting surface 28 supporting the black ink and cyan ink ejection nozzles 24*k*, 24*c*, and then the nozzle supporting surface supporting the yellow ink and magenta ink ejection nozzles. When the ink jet recording apparatus (printer) is not used, the carriage 10 is moved to a position where the two recording heads 20 are opposed to two maintenance caps 36, respectively. Thus, all the nozzles 24 are covered by the caps 36.

Figure 5:
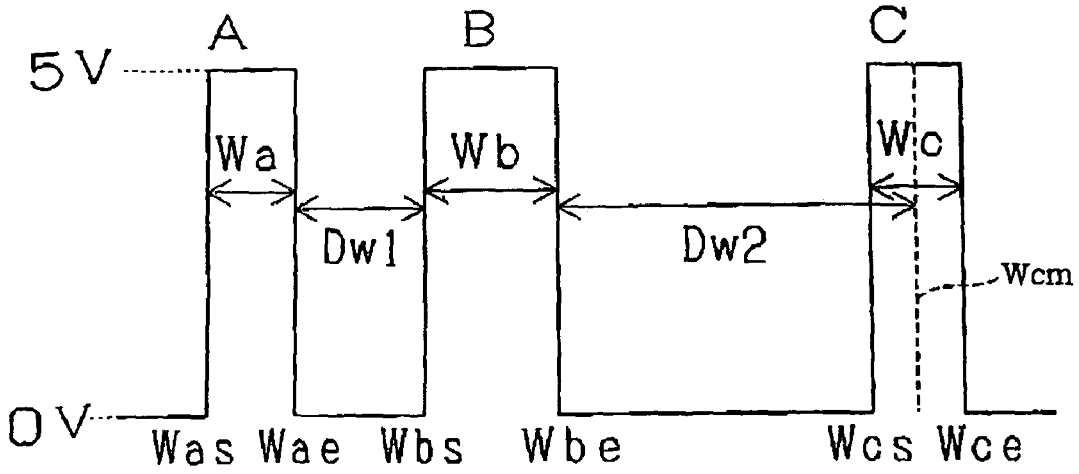
FIG. 5 is a graph showing a waveform of the control signal InA.
Figure 6:
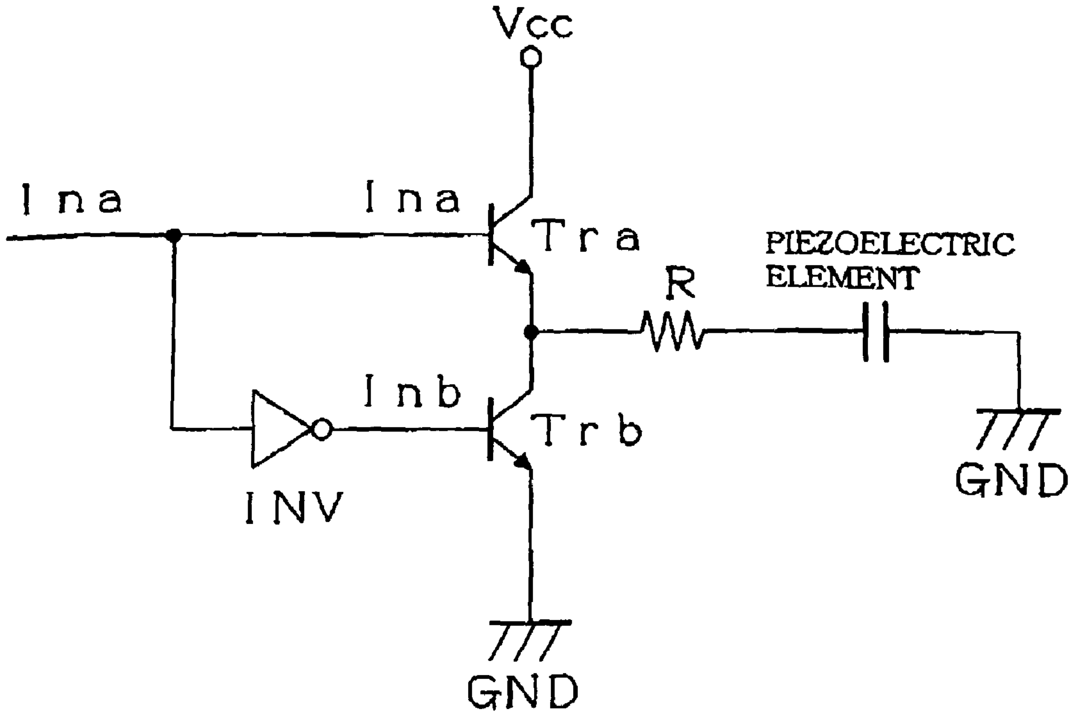
FIG. 6 is a view showing a conventional totem pole circuit including a first bipolar transistor Tra and a second bipolar transistor Trb.
Figure 7:
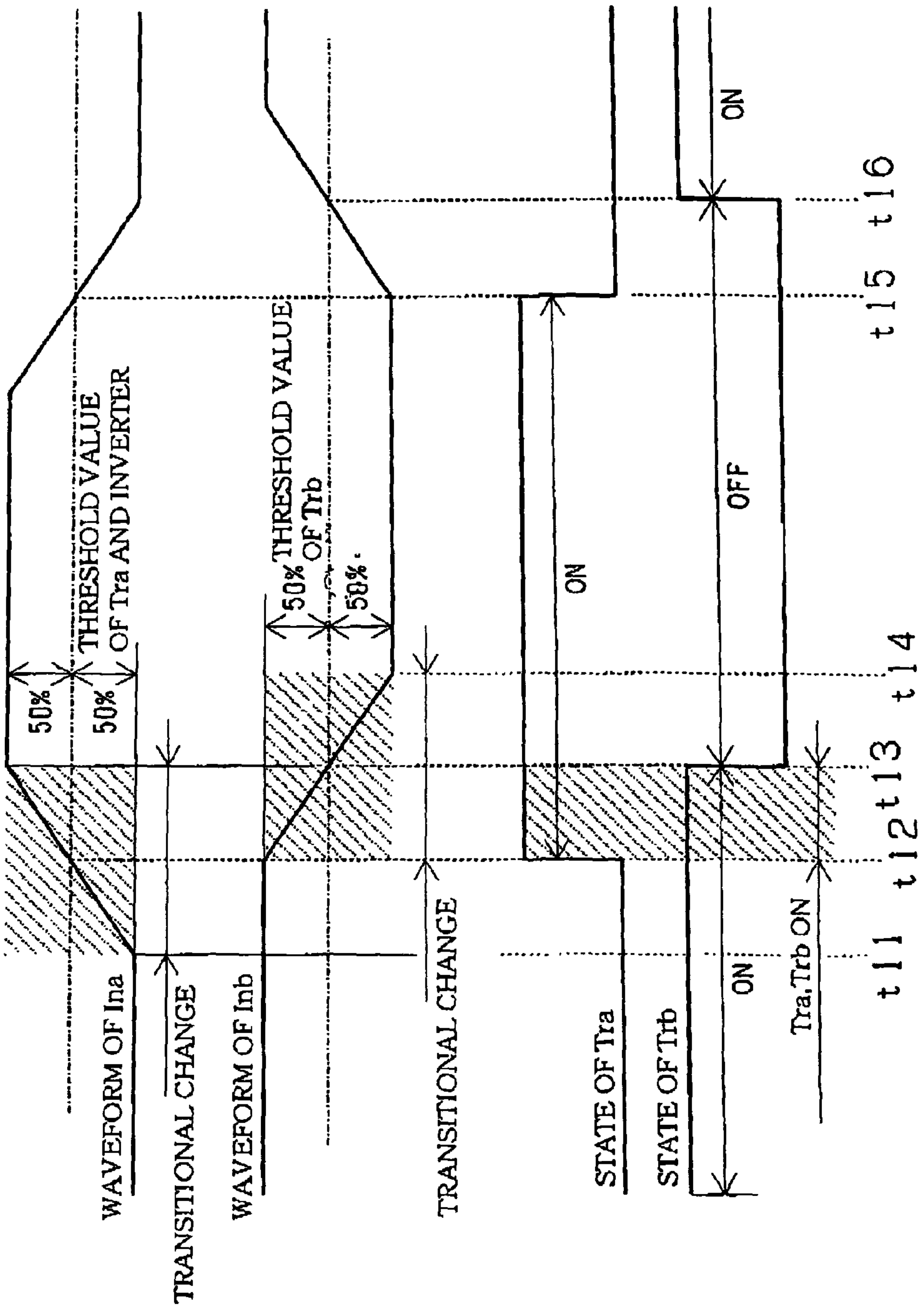
FIG. 7 is a time chart corresponding to FIG. 4, and showing a waveform of a control signal Ina produced in the conventional totem pole circuit of FIG. 6, a waveform of an inverted control signal Inb that is produced by inverting the control signal InA, a state of the first bipolar transistor Tra, and a state of the second bipolar transistor Trb.

FIG. 5 shows a control signal InA (FIG. 6) that is used to drive each one of the ink jet recording heads 20. A waveform of the control signal includes two ejection pulses A, B for ejecting a droplet of ink from each one of the pressure chambers 22 (22*k*, 22*c*), and a non-ejection pulse C for attenuating a pressure wave or oscillation remaining in the each one pressure chamber 22. A height (i.e., a voltage) of each of the ejection pulses A, B and the non-ejection pulse C is, e.g., 5 V. In the present embodiment, a width Wa of the ejection pulse A is equal to half a one-way propagation time T that is a time needed for a pressure wave to propagate one way (L) in each pressure chamber 22. Thus, the width Wa is equal to 4 μsec. A width Wb of the ejection pulse B is equal to the one-way propagation time T, i.e., 8 μsec. In addition, a time Dw1 between an ending time Wae of the ejection pulse A and a starting time Wbs of the ejection pulse B is equal to the one-way propagation time T, i.e., 8 μsec. A width Wc of the non-ejection pulse C is equal to half the one-way propagation time T (L/a: a is a velocity of the pressure wave), i.e., 4 μsec. A time Dw2 between an ending time Wbe of the ejection pulse B and an average time of a starting time Wcs, and an ending time Wce, of the non-ejection pulse C is equal to the product of the one-way propagation time T and 2.5, i.e., 20 μsec.

At a time when the pressure wave caused by the ejection pulses A, B but remaining yet in each pressure chamber 22 increases the pressure of the ink present in the chamber 22, the non-ejection pulse C is started to increase the volume of the chamber 22 and thereby prevent the increase of the ink pressure; and at a time when the remaining pressure wave decreases the pressure of the ink in the chamber 22, the non-ejection pulse C is ended to return the increased volume of the chamber 22 to its initial volume and thereby prevent the decrease of the ink pressure. Thus, the non-ejection pulse C attenuates the pressure wave remaining in the chamber 22.

Figure 3:
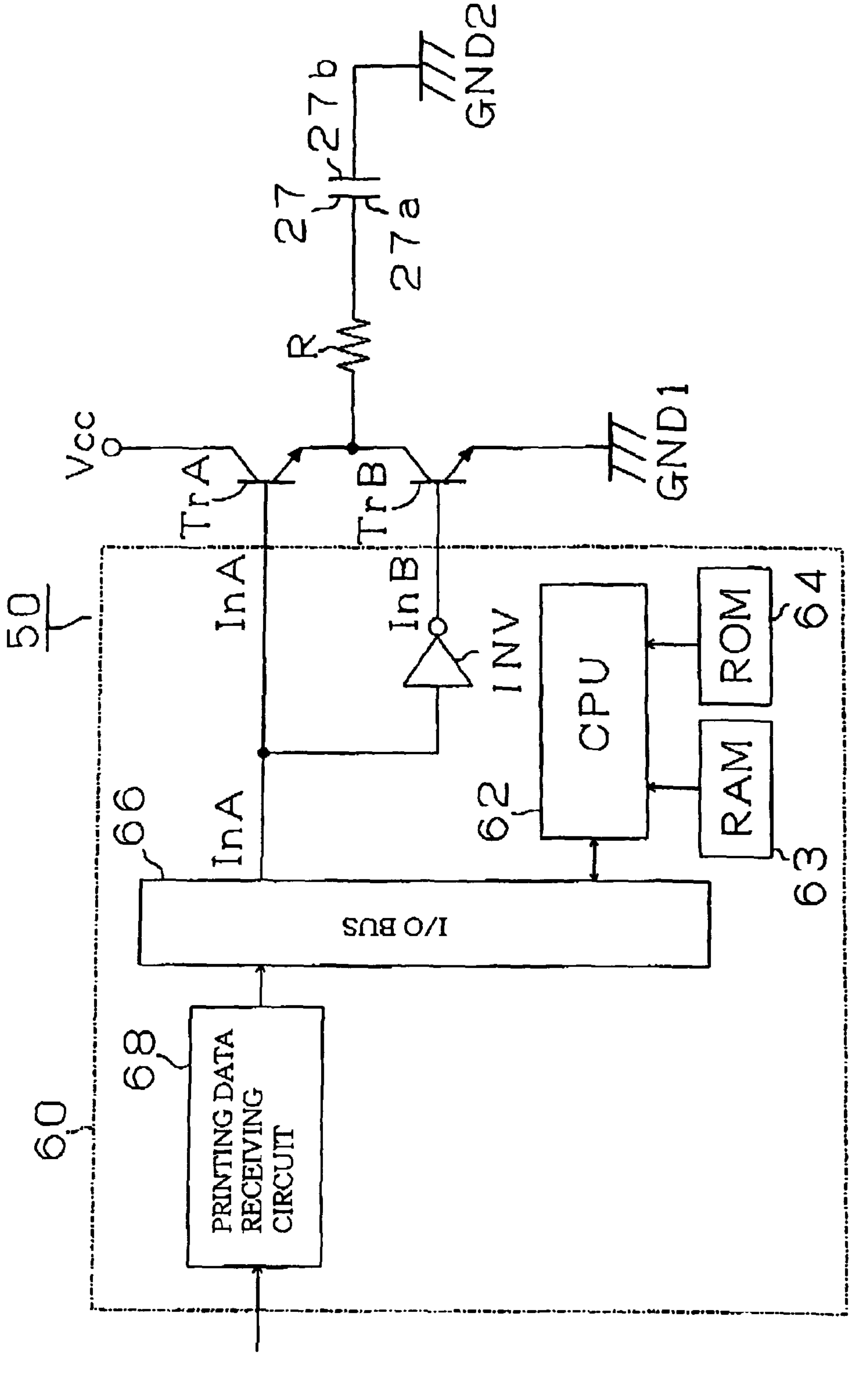
FIG. 3 is a view of a driver circuit that drives the ink jet recording head of FIG. 2 and includes a first bipolar transistor TrA and a second bipolar transistor TrB.

Next, there will be described, by reference to FIG. 3, a construction of a driver circuit 60 that applies a drive voltage to each one of the piezoelectric elements 27 (27*k*, 27*c*) of the ink jet recording heads 20.

The driver circuit 50 includes a first bipolar transistor TrA that supplies a high drive voltage (e.g., 20 V) of an electric voltage source Vcc (i.e., one end of an electric voltage source), to each one of the piezoelectric actuators 27 so as to electrically charge the each piezoelectric actuator 27; a second bipolar transistor TrB that discharges the electric charge of the each piezoelectric actuator 27 to a ground GND1 (i.e., the other end of the electric voltage source); and a pulse control circuit 60.

The pulse control circuit 60 includes a CPU (central processing unit) 62 that performs various sorts of calculations, and a RAM (random access memory) 63 and a ROM (read only memory) 64 each of which is connected to the CPU 62. The RAM 63 stores printing data and various sorts of control data; and the ROM 64 stores a control program used by the pulse control circuit 60, and sequence data used to produce ON and OFF signals corresponding to the control signal InA described above by reference to FIG. 5.

In addition, the CPU 62 is connected to an I/O (input and output) bus 66 so as to communicate various sorts of data therewith. To the I/O bus 66, a printing-data receiving circuit 68 and the first bipolar transistor TrA are directly connected, and the second bipolar transistor TrB is connected indirectly via an inverter INV. The CPU 62 controls, based on the sequence data stored in the ROM 64, respective operations of the first and second bipolar transistors TrA, TrB.

The first and second bipolar transistors TrA, TrB cooperate with each other to constitute a so-called totem pole circuit. More specifically described, the fist and second bipolar transistors TrA, TrB are connected in series to the power source Vcc and the ground GND, and a first electrode 27*a* of the piezoelectric actuator 27 is connected via a resistor R to a connection point where the two bipolar transistors TrA, TrB are connected to each other. A pulse-like control signal InA, described above by reference to FIG. 5, is applied to a base of the first bipolar transistor TrA, and an inverted control signal InB, produced by inverting the control signal InA using the inverter INV, is applied to the second bipolar transistor TrB. A second electrode 27*b* of the piezoelectric actuator 27 is connected to a ground GND2.

When the I/O bus 66 outputs an ON signal (+5 V: a high level (i.e., the highest voltage) of the control signal InA shown in FIG. 5) to the base of the first bipolar transistor TrA, the first transistor TrA turns electrically conductive, so that a drive voltage supplied from the positive-potential power source Voc flows in a direction from an emitter, to a collector, of the first transistor TrA, and electrically charges the piezoelectric actuator 27 via the resistor R. In addition, the ON signal outputted by the I/O bus 66 is inverted by the inverter INV, so that the inverted ON signal is made equal to 0 V and is applied to the base of the second bipolar transistor TrB. Thus, the second transistor TrB turns not electrically conductive, so that the drive voltage is inhibited from flowing a direction from an emitter, to a collector, of the second transistor TrB.

On the other hand, when the I/O bus 66 outputs an OFF signal (0 V: a low level (i.e., the lowest voltage) of the control signal InA shown in FIG. 5) to the base of the first bipolar transistor TrA, the first transistor TrA turns not electrically conductive, so that the drive voltage supplied from the positive-potential power source Vcc is inhibited from flowing through the first transistor TrA. In addition, the OFF signal outputted by the I/O bus 66 is inverted by the inverter INV, so that the inverted OFF signal is made equal to +5 V and is applied to the base of the second transistor TrB. Thus, the second transistor TrB turns electrically conductive, so that the electric charge of the piezoelectric actuator 27 is discharged to the ground GND1.

In the present ink jet recording head driver circuit 50, a threshold voltage to turn on and off the first bipolar transistor TrA and a threshold voltage to turn on and off the second bipolar transistor TrA are pre-set such that a time duration in which the first transistor TrA is kept on, and a time duration in which the second transistor TrB is kept on do not overlap each other. In other words, the first and second transistors TrA, TrB having those pre-set threshold voltages are employed in the present embodiment. For example, in the case where an electric-potential threshold value of the base (gate) of the first transistor TrA that turns on the same TrA is increased, an increased time is needed before the first transistor TrA is turned on when the control signal InA is changed from its low level to its high level, and a decreased time is needed before the first transistor TrA is turned off when the control signal InA is changed from its high level to its low level. Preferably, the electric-potential threshold value of the base of the first transistor TrA is not lower than 60% (3 V) of the highest electric potential (5 V) of the control signal InA, more preferably, not lower than 75% (3.75 V) of the highest electric potential. In addition, in the case where an electric-potential threshold value of the base (gate) of the second transistor PB that turns on the same TrB is increased, a decreased time is needed before the second transistor TrB is turned off when the inverted control signal InB is changed from its high level to its low level, and an increased time is needed before the second transistor TrB is turned on when the inverted control signal InB is changed from its low level to its high level. Preferably, the electric-potential threshold value of the base of the second transistor TrB is not lower than 60% (3 V) of the highest electric potential (5 V) of the inverted control signal InB, more preferably, not lower than 75% (3.75 V) of the highest electric potential Therefore, when the control signal InA applied to the first transistor TrA is changed from its low level to its high level and the inverted control signal InB is applied to the base (gate) of the second transistor TrB, the first transistor TrA is turned on after the second transistor TrB is turned off. In addition, when the control signal InA applied to the first transistor TrA is changed from its high level to its low level and the inverted control signal InB is applied to the second transistor TrB, the first transistor TrA is turned off before the second transistor TrB is turned on. Thus, the first and second transistors TrA, TrB are prevented from being concurrently turned on.

In the present driver circuit 50, a threshold value, $th_{TrA}$, as the threshold voltage of the first bipolar transistor TrA, a threshold value, $th_{TrB}$, as the threshold voltage of the second bipolar transistor TrB, and a threshold value, $th_{INV}$, as the threshold voltage of the inverter INV satisfy the following expressions (1), (2), when the voltage of each increasing portion of the control signal InA and the voltage of each decreasing portion of the inverted control signal InB are regarded as increasing and decreasing, respectively, in proportion to time, t, at a common slope, a (>0):

$$th_{TrA}+th_{TrB}>100+th_{INV} \quad (1)$$

$$th_{TrA}>th_{INV} \quad (2)$$

where each of the threshold values, $th_{TrA}$, $th_{TrB}$, $th_{INV}$ is a percentage (%) of the highest voltage of the control signal InA; and 100 is a hundred percent of the highest voltage of the control signal.

The first transistor TrA must be turned on after the second transistor TrB is turned off Therefore, a time duration, $t_{TrA}$, from a time when the control signal InA starts increasing to a time when the first converter TrA is turned on must be longer than a time duration, $t_{TrB}$, from the time when the control signal InA starts increasing to a time when the second converter TrB is turned of. Thus, the following expression is obtained: $t_{TrA}>t_{TrB}$. When the voltage of each increasing portion of the control signal InA and the voltage of each decreasing portion of the inverted control signal InB are regarded as increasing and decreasing, respectively, in proportion to time t at the common slope a (>0), the following expressions are obtained: $t_{TrA}=th_{TrA}/a$, and $t_{TrA}=th_{INV}/a+(100-th_{TrB})/a$. From these expressions, the above-indicated expression (1) is derived. In addition, since the converted control signal InB starts decreasing at a time when the inverter INV is turned on, the time duration $t_{TrA}$ must be longer than a time duration, $t_{INV}$, from the time when the control signal InA starts increasing to the time when the inverter INV is turned on. Thus, the following expression is obtained: $t_{TrA}=th_{TrA}/a>t_{INV}=th_{INV}/a$ and, from this expression, the above-indicated expression (2) is obtained.

Generally, the voltage, E, of the control signal InA can be expressed as a function, g(t), of time t, and accordingly each of the above-indicated time durations $t_{TrA}$, $t_{TrB}$, $t_{INV}$ can be expressed as an inverse function, $g^{-1}(E)$, of the voltage E. Therefore, generally, the above-indicated three threshold values $th_{TrA}$, $th_{TrB}$, $th_{INV}$ must satisfy the following expressions: $t_{TrA}=g^{-1}(th_{TrA})>t_{TrB}=g^{-1}(th_{TrA})$ and $t_{TrA}=g^{-1}(th_{TrA})>t_{INV}=g^{-1}(th_{INV})$.

In the above-indicated expressions (1), (2), it is preferred that the threshold voltage $th_{INV}$ of the inverter INV range from about 10%, to about 90%, of the highest voltage of the control signal InA.

Figure 4:
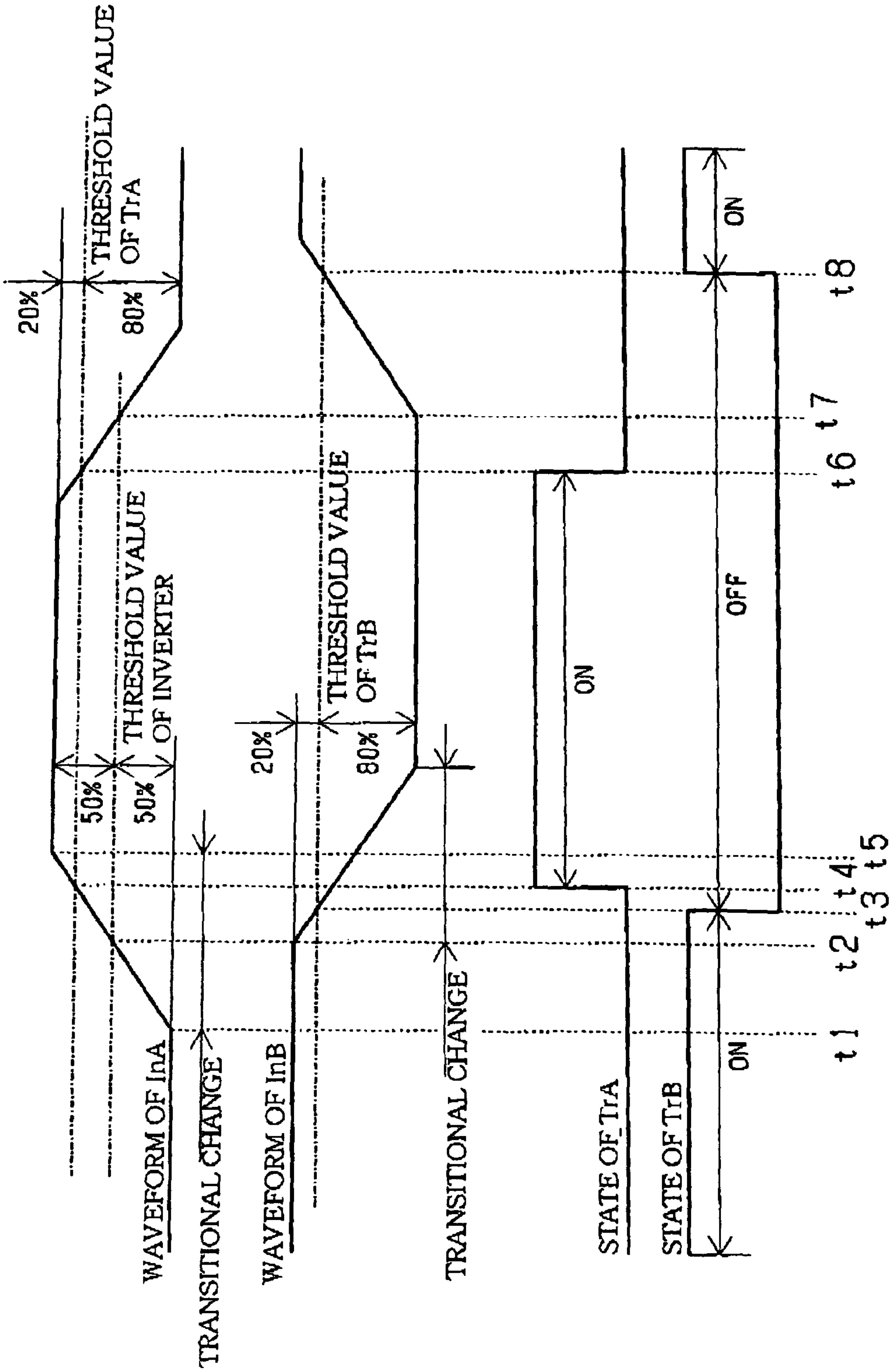
FIG. 4 is a time chart showing a waveform of a control signal InA produced in the driver circuit of FIG. 3, a waveform of an inverted control signal InB that is produced by inverting the control signal InA, a state of the first bipolar transistor TrA, and a state of the second bipolar transistor TrB.

The manner in which the first and second transistors TrA, TrB are prevented from being concurrently turned on will be described in detail by reference to the time chart of FIG. 4 that shows a waveform of the control signal InA, a waveform of the inverted control signal InB produced by inverting the control signal InA, an operation state of the first transistor TEA, and an operation state of the second transistor TrB.

When the control signal InA is changed from its low level to its high level the voltage of the control signal InA gradually increases between a time t1 and a time t5. Here it is noted that this transitional change of the signal voltage is, in fact, represented by a complex quadratic curve but, in FIG. 4, it is approximated by a straight line. In the present embodiment, a threshold voltage value of the inverter INV is pre-set at 50% of the highest electric potential (5V) of the control signal InA, i.e., an average (2.5 V) of the low level (0 V) and the high level (5V) of the control signal InA. Therefore, when the control signal InA is changed from its low level to its high level, an output of the inverter INV, i.e., the inverted control signal InB starts changing from its high level (5 V) to its low level (0 V), at a time t2 when the electric potential of the control signal InA becomes equal to the above-indicated threshold voltage, 50% (2.5 V), of the inverter INV. In the present embodiment, a threshold voltage value of the second transistor TrB is pre-set at 80% (4 V) of the highest electric potential of the inverted control signal InB. Therefore, at a time t3 when the electric potential of the inverted control signal InB becomes equal to the threshold voltage value, 80% (4 V), of the second transistor TrB, the second transistor TrB turns off. In the present embodiment, a threshold voltage value of the first transistor TrA is pre-set at 80% (4 V) of the highest electric potential of the control signal InA. Therefore, at a time t4 when the electric potential of the control signal InA becomes equal to the threshold voltage value, 80% (4 V), of the fist transistor TrA, the first transistor TrA turns on. Thus, since the first transistor TrA turns on at time t4 after the second transistor TrB turns off at time t3, the first and second transistors TrA, TrB can be reliably prevented from being concurrently turned on.

The piezoelectric actuator 27 discharges its electric charge, as follows: At a time t6 when the electric potential of the control signal InA becomes equal to the threshold voltage value, 80%(4V), of the first bipolar transistor TrA, the first transistor TrA turns off. Then, at a time t7, the electric potential of the inverted control signal InB starts changing from its low level to its high level and, at a time t8 when the electric potential of the drive signal InB becomes equal to the threshold voltage value, 80% (4V), of the second transistor TrB, the second transistor TrB turns on. Thus, the first and second transistors TrA, TrB can be reliably prevented from being concurrently turned on.

Since the first and second bipolar transistors TrA, TrB can be reliably prevented from being concurrently turned on, the electric potential of the ground GND1 can be prevented from being excessively largely changed, and accordingly an IC (integrated circuit) that drives the ink jet recording heads 20 can be prevented from falling in failure and back biases can be prevented from being applied to other transistors etc. of the IC.

The ink jet recording apparatus includes the same number of ink jet recording head driver circuits 50 as the number of the ink ejection nozzles 24, i.e., the number of the piezoelectric actuators 27. Though one driver circuit 50 corresponding to one ink ejection nozzle 24 has been described above as a representative of all the driver circuits 50, each of the other driver circuits 50 has the same construction as described above and operates in the same manner as described above.

In the illustrated embodiment, the bipolar transistors TrA, TrB are employed as switching elements that cooperate with each other to control the application of the drive voltage to the piezoelectric element 27. However, the bipolar transistors TrA, TrB may be replaced with field-effect transistors. In addition, in the illustrated embodiment, the totem pole circuit is employed as the ink jet recording head driver circuit. However, the principle of the present invention is applicable to various sorts of driver circuits that apply respective pulse-like electric potentials to various sorts of driven loads.

It is to be understood that the present invention may be embodied with other changes and improvements that may occur to a person skilled in the art, without departing from the spirit and scope of the invention defined in the claims.

What is claimed is:

1. A driver circuit, comprising:

a first switching element and a second switching element which are connected in series to two ends of an electric voltage source, such that a driven load having a capacity is connected to a connection line connecting the first and second switching elements to each other; and an inverter which inverts, when a control signal having a variable voltage is applied to the first switching element, the control signal into an inverted control signal, so that the inverted control signal is applied to the second switching element, wherein in a state in which the first switching element is turned on by the control signal and the second switching element is turned off by the inverted control signal, a drive voltage is applied from one of the two ends of the electric voltage source to the driven load and, in a state in which the first switching element is turned off by the control signal and the second switching element is turned on by the inverted control signal, an electric charge of the driven load is discharged to an other of the two ends of the electric voltage source, and wherein a first threshold voltage to turn on the first switching element and a second threshold voltage to turn off the second switching element are pre-set such that a first time duration in which the first switching element is turned on and a second time duration in which the second switching element is turned on do not overlap each other, wherein a first threshold value, $th_{TrA}$, as the first threshold voltage, a second threshold value, $th_{TrB}$, as the second threshold voltage, and a third threshold value, $th_{INV}$, as a third threshold voltage to turn on the inverter to start inverting the control signal into the inverted control signal, satisfy following expressions, when a voltage of a variable portion of the control signal and a voltage of a variable portion of the inverted control signal are regarded as increasing and decreasing, respectively, in proportion to time at a common slope:

$$th_{TrA}+th_{TrB}>100+th_{INV} \quad (1)$$

$$th_{TrA}>th_{INV} \quad (2)$$

wherein each of the first, second, and third threshold values, $th_{TrA}$, $th_{TrB}$, $th_{INV}$, is a percentage (%) of a highest voltage of the control signal; and 100 is a hundred percent of the highest voltage of the control signal.

2. The driver circuit according to claim 1, wherein the third threshold value $th_{INV}$ ranges from about 10%, to about 90%, of the highest voltage of the control signal.

3. The driver circuit according to claim 1, wherein each of the first and second switching elements comprises a transistor.

4. The driver circuit according to claim 1, wherein said one end of the electric voltage source comprises a positive-potential electric voltage source, and said other end of the electric voltage source comprises a ground.

5. The driver circuit according to claim 1, further comprising a control device which produces the control signal having the variable voltage.

6. The driver circuit according to claim 5, wherein the control device produces, as the control signal, a pulse signal including a low voltage level, a high voltage level, and an intermediate portion varying from the low voltage level to the high voltage level.

7. The driver circuit according to claim 6, wherein the intermediate portion of the pulse signal is regarded as varying in proportion to time.

8. The driver circuit according to claim 1, wherein the driven load comprises an ink jet recording head which ejects a droplet of ink.

9. The driver circuit according to claim 8, wherein the ink jet recording head has an ink ejection nozzle, and a piezoelectric element which is deformed, when being driven by the drive voltage, to eject the droplet of ink from the ink ejection nozzle.

* * * * *